United States Patent
Ishibashi

(10) Patent No.: US 9,670,584 B2
(45) Date of Patent: Jun. 6, 2017

(54) PLASMA PROCESSING DEVICE

(75) Inventor: Kiyotaka Ishibashi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 559 days.

(21) Appl. No.: 14/118,993

(22) PCT Filed: May 21, 2012

(86) PCT No.: PCT/JP2012/062955
§ 371 (c)(1),
(2), (4) Date: Nov. 20, 2013

(87) PCT Pub. No.: WO2012/161164
PCT Pub. Date: Nov. 29, 2012

(65) Prior Publication Data
US 2014/0102367 A1    Apr. 17, 2014

(30) Foreign Application Priority Data
May 23, 2011    (JP) .................... 2011-114657

(51) Int. Cl.
*C23C 16/00*    (2006.01)
*C23F 1/00*    (2006.01)
(Continued)

(52) U.S. Cl.
CPC ...... *C23C 16/511* (2013.01); *C23C 16/45536* (2013.01); *H01J 37/3244* (2013.01);
(Continued)

(58) Field of Classification Search
USPC ............. 118/723 MW, 723 ME; 156/345.35, 156/345.41
See application file for complete search history.

(56) References Cited

U.S. PATENT DOCUMENTS 5,804,033 A  *  9/1998  Kanai ............... H01J 37/32229
                                              118/723 MW
6,433,298 B1 *  8/2002  Ishii ................. H01J 37/32192
                                              118/723 MW
(Continued)

FOREIGN PATENT DOCUMENTS

JP    1-23537 A    1/1989
JP    64-23537 A    1/1989
(Continued)

OTHER PUBLICATIONS

English Machine Translation JP 2763291, Otsubo et al dated Jan. 26, 1989.*
(Continued)

*Primary Examiner* — Rakesh Dhingra
(74) *Attorney, Agent, or Firm* — Rothwell, Figg, Ernst & Manbeck, P.C.

(57) ABSTRACT

A plasma processing device including a stage for holding a substrate, a processing vessel, a first supply unit, a masking portion, a dielectric member, a microwave introduction unit, and a second supply unit. The first supply unit supplies a first process gas for layer deposition to the processing space. The masking portion is electrically conductive and has a first surface facing the processing space, a second surface at an opposite side, and one or more through holes extending from the first surface to the second surface. The dielectric member is in contact with the second surface of the masking portion, and is formed with one or more cavities connected to the one or more through holes. The microwave introduction unit introduces microwaves to the dielectric member. The second supply unit supplies a second process gas for plasma processing into the cavities of the dielectric member.

14 Claims, 11 Drawing Sheets

(51) Int. Cl.
  *H01L 21/306* (2006.01)
  *C23C 16/511* (2006.01)
  *C23C 16/455* (2006.01)
  *H01J 37/32* (2006.01)

(52) U.S. Cl.
  CPC .. *H01J 37/32192* (2013.01); *H01J 37/32229* (2013.01); *H01J 37/32357* (2013.01)

(56) References Cited

U.S. PATENT DOCUMENTS

| | | | |
|---|---|---|---|
| 6,911,391 B2 | 6/2005 | Yang et al. | |
| 2009/0004887 A1* | 1/2009 | Suzuki | C23C 16/4586 438/792 |
| 2010/0075066 A1* | 3/2010 | Ueda | C23C 16/402 427/575 |
| 2011/0108195 A1* | 5/2011 | Nishimoto | H01J 37/32192 156/345.37 |

FOREIGN PATENT DOCUMENTS

| | | | |
|---|---|---|---|
| JP | 8-124861 A | | 5/1996 |
| JP | WO 2008/047520 | * | 4/2008 |
| JP | 2008-538127 A | | 10/2008 |
| JP | 2009-99583 A | | 5/2009 |
| JP | 2009-231611 A | | 10/2009 |
| JP | WO 2010/001890 | * | 1/2010 |
| WO | 2006/101856 A2 | | 9/2006 |

OTHER PUBLICATIONS

International Search Report mailed Aug. 21, 2012 in PCT/JP2012/062955.

\* cited by examiner

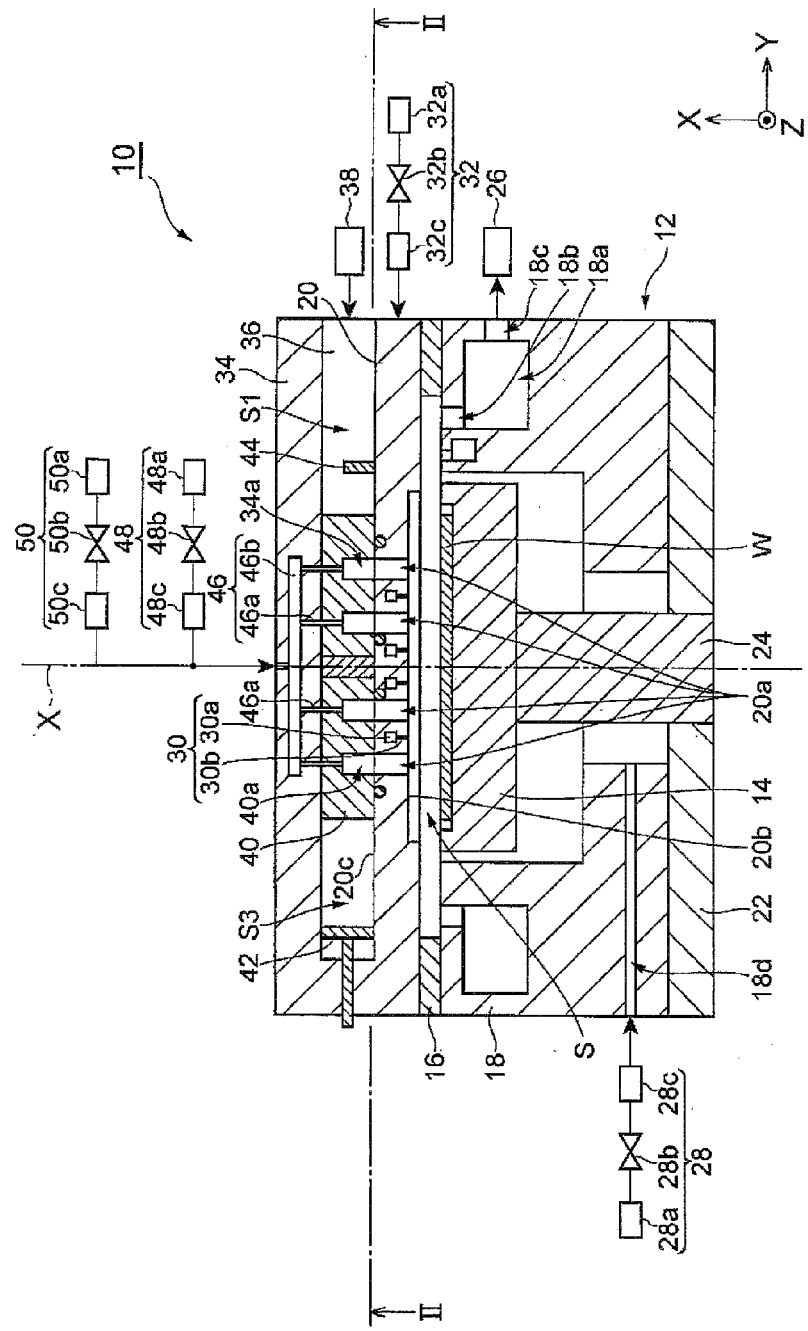

PLASMA PROCESSING DEVICE

CROSS REFERENCE TO RELATED APPLICATION

This application is a 35 U.S.C. 371 National Phase Entry Application from PCT/JP2012/062955, filed May 21, 2012, which claims the benefit of Japanese Patent Application No. 2011-114657, filed May 23, 2011, the disclosures of which are incorporated herein in their entirety by reference.

TECHNICAL FIELD

Exemplary embodiments of the present disclosure relate to a plasma processing device.

BACKGROUND ART

An atomic layer deposition (ALD) method using a radical reaction is known as a method of forming a film on a substrate to be processed. In the ALD method, a raw material gas is supplied on the substrate to be processed in a first processing process. Subsequently, purging is performed in a first purge process. By the purging, a layer chemisorbed on the substrate to be processed (e.g., a single atomic layer or a single molecular layer) is left, and the remainder physisorbed or chemisorbed on the substrate to be processed is removed. Subsequently, a plasma processing is carried out on the layer on the substrate to be processed in a second processing process. In the plasma processing, for example, the layer on the substrate to be processed is nitrided or oxidized. Subsequently, purging is performed again in a second purge process.

In such an ALD method, for example, a plasma processing device disclosed in FIG. 2A of Patent Document 1 is used. The plasma processing device disclosed in FIG. 2A of Patent Document 1 is a parallel flat plate type of a plasma processing device. The processing of a first processing process and plasma generation of a second processing process are performed within the same space. Patent Document 2, likewise, discloses a parallel flat plate type plasma processing device. A processing space in a first processing process is separated from a plasma generation space in a second processing process by an electrically conductive masking plate.

The ALD method may be performed using a plasma processing device which uses microwaves as a plasma source and is high in frequency as well as in radical generation efficiency as compared to the parallel flat plate-type plasma processing device. Such a technology is disclosed in, for example, FIG. 16 of Patent Document 1. In the plasma processing device disclosed in FIG. 16 of Patent Document 1, a processing of a first processing process and plasma generation of a second processing process are performed within the same space. In the plasma processing device, a plasma generation space that is a space in the vicinity of a dielectric window, and a substrate to be processed are considerably spaced apart from each other so as to avoid the damage of the substrate to be processed.

Patent Document 3 discloses a plasma processing device using microwaves, in which a processing space in a first processing process is separated from a plasma generation space in a second processing process by an electrically conductive member.

PRIOR ART DOCUMENT

Patent Document

Patent Document 1: Japanese National Phase Patent Laid-Open Publication No.
Patent Document 2: US Patent No. 6911391
Patent Document 3: Japanese Patent Laid-Open No. 2009-99583

DISCLOSURE OF THE INVENTION

Problems to be Solved

The inventor of the present disclosure has performed research on a plasma processing device using microwaves. In this research, the inventor of the present disclosure has employed a configuration of separating a processing space of a first processing process from a plasma generation space of a second processing process by an electrically conductive member. However, the inventor of the present disclosure has found that in the device disclosed in Patent Document 3, radicals are deactivated until reaching a substrate to be processed, thereby increasing a processing time.

Accordingly, what is requested in a plasma processing device that uses microwaves as a plasma source and may be used for an ALD method is to shorten a processing time for plasma processing.

Means for Solving the Problems

A plasma processing device according to an aspect of the present disclosure includes a stage, a processing vessel, a first supply unit, a masking portion, a dielectric member, a microwave introduction unit and a second supply unit. The stage is mounted with a substrate to be processed. The processing vessel defines a processing space above the stage. The first supply unit supplies a first process gas for layer deposition to the processing space. The masking portion is electrically conductive and has a first surface facing the processing space, and a second surface at the opposite side to the first surface. The masking portion is formed with one or more through holes extending from the first surface to the second surface. The dielectric member is provided to be in contact with the second surface of the masking portion. The dielectric member is formed with one or more cavities connected to the one or more through holes. The microwave introduction unit introduces microwaves to the dielectric member. The second supply unit supplies a second process gas for plasma processing into the cavities of the dielectric member.

In the plasma processing device, plasma is generated within cavities of the dielectric member provided right above the masking portion. That is, a plasma generation space is separated from the processing space by the masking portion. Accordingly, damage to the substrate to be processed may be reduced. The second process gas is supplied into the cavities and is activated. From this, radicals generated within the cavities are supplied to the processing space via the through holes of the masking portion. The dielectric member configured to define the cavities is in contact with the masking portion, and thus a distance from the cavities to the processing space is short. Accordingly, the amount of radicals deactivated until the radicals are generated within the cavities and supplied to the processing space may be reduced. As a result, the processing time of plasma processing may be shortened.

According to an exemplary embodiment, the one or more cavities may be one or more columnar spaces formed in the dielectric member. According to the exemplary embodiment, the one or more cavities may be one or more annular grooves formed in the dielectric member. Because the cavities are relatively small spaces, the efficiency of generating plasma within the cavities may be improved.

According to an exemplary embodiment, the dielectric member may be formed with a communication path that is configured to communicate between at least two among the plural cavities. In the exemplary embodiment, plasma may be uniformly generated in the two or more cavities connected by the communication path.

According to an exemplary embodiment, the microwave introduction unit may include a coaxial waveguide. In the exemplary embodiment, the coaxial waveguide may be coupled with the masking portion through the dielectric member. In the exemplary embodiment, the microwave introduction unit may include a slot plate which is made of a metal. The slot plate may be coupled with the coaxial waveguide and formed with a plurality of slots in a circumferential direction and a radial direction. The dielectric member may constitute a dielectric window provided between the slot plate and the masking portion.

According to an exemplary embodiment, a cross-sectional area of each of the one or more through holes may be smaller than a cross-sectional area of the one or more cavities. In the exemplary embodiment, the first process gas may be suppressed from flowing into the cavities, and the leakage of the plasma from the cavities to the processing space may be suppressed more securely.

According to an exemplary embodiment, the plural through holes may be connected to one cavity. In the exemplary embodiment, the amount of radicals supplied to the processing space may be further increased. As a result, the processing time of plasma processing may be shortened.

According to an exemplary embodiment, a distance between a placing surface of the stage on which a substrate to be processed is placed and the first surface may range from 5 mm to 40 mm. By setting the distance between the first surface and the stage in this range, the processing time of plasma processing may be further shortened.

According to an exemplary embodiment, the masking portion and the dielectric member may be provided at a lateral side of the processing space. In the exemplary embodiment, a distance between the stage and the first surface may be set such that a shortest distance between the first surface and an edge of the substrate mounted on the stage ranges from 5 mm to 60 mm. By setting the distance between the first surface and the stage in this range, the processing time of plasma processing may be further shortened.

Effect of the Invention

As described above, according to an aspect of the present disclosure, there is provided a plasma processing device which uses microwaves, and is capable of shortening a processing time by plasma processing. The plasma processing device may be used in an ALD method.

BRIEF DESCRIPTION OF THE DRAWINGS

FIG. 1 is a view schematically illustrating a plasma processing device according to an exemplary embodiment.

MODE FOR CARRYING OUT THE INVENTION

Figure 2A:
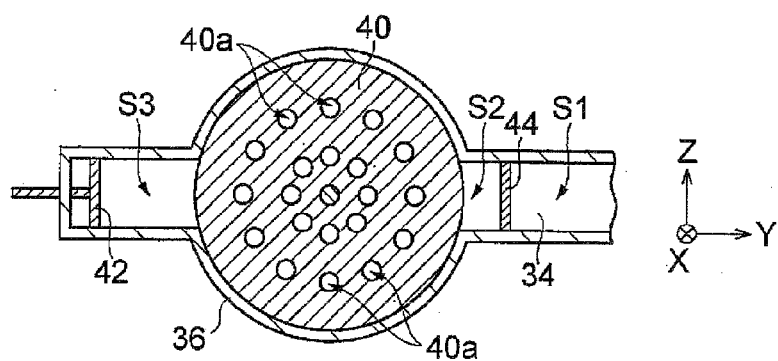
FIGS. 2A to 2C illustrate cross-sectional views taken along line II-II in FIG. 1.

Hereinafter, various exemplary embodiments will be described in detail with reference to the accompanying drawings. In the respective drawings, the same or corresponding portions are given the same symbols.

FIG. 1 is a view schematically illustrating a plasma processing device according to an exemplary embodiment. In FIG. 1, a cross-section of the plasma processing device is illustrated. The plasma processing device 10 illustrated in FIG. 1 is provided with a processing vessel 12 and a stage 14.

The processing vessel 12 defines a processing space S. The processing vessel 12 may be made of a meal such as, for example, stainless steel or aluminum. In an exemplary embodiment, the processing vessel 12 includes a first side wall 16, a second side wall 18, a top plate portion 20 and a bottom portion 22. The first side wall 16 has a substantially cylindrical shape that extends along the axis X. In the present exemplary embodiment, the inside space of the first side wall 16 becomes the processing space S. The second side wall 18 extends downwardly in succession to the first side wall 16. The second side wall 18 also has a substantially cylindrical shape that extends along the axis X.

The stage 14 is provided in the inside space of the second side wall 18. A substrate to be processed W is placed on the top surface (placing surface) of the stage 14. The stage 14 may adsorb the substrate to be processed W by, for example, an electrostatic force (static electricity/Coulomb's force). The processing space S exists above the stage 14. In an exemplary embodiment, the plasma processing device 10 may be further provided with a post 24 that extends below the stage 14. The post 24 may hold the stage 14.

A space 18a is formed in the second side wall 18. The space 18a may extend along an annular closed curve around the axis X. A hole 18b that connects the processing space S to the space 18a is formed in the second side wall 18. A hole 18c that extends from the space 18a to the outer surface of the second side wall 18 is formed in the second side wall 18. In an exemplary embodiment, the plasma processing device 10 may be further provided with an exhaust device 26 that is connected to the hole 18c. Decompression/exhaust of the processing space S is performed by the exhaust device 26.

In the second side wall 18, a gas path 18d is formed which extends from a space between the outer periphery of the stage 14 and the second side wall 18 to the outer surface of the second side wall 18. A gas supply system 28 is connected to the gas path 18d. The gas supply system 28 supplies a purge gas to the processing space S. As for the purge gas, an inert gas such as argon is used. The gas supply system 28 has a gas source 28a, a valve 28b, and a flow controller 28c. The gas source 28a is a gas source of the purge gas. The valve 28b is connected to the gas source 28a, and switches supplying of the purge gas from the gas source 28a and stopping the supplying. The flow controller 28c is, for example, a mass flow controller, and controls the flow rate of the purge gas to the processing space S.

A bottom portion 22 is provided at the lower end of the second side wall 18. The upper end opening of the first side wall 16 is closed by the top plate portion 20. The top plate portion 20 is electrically conductive, and defines the processing space S at the top of the processing space S. The top plate portion 20 constitutes a masking portion which separates a plasma generation space to be described later from the processing space S.

A first gas supply unit 30 is provided in the top plate portion 20. The first gas supply unit 30 supplies a first process gas for atomic layer deposition to the processing space S. Specifically, the first gas supply unit 30 may include a gas path 30a and a plurality of holes 30b. The gas path 30a may extend along an annular closed curve around the axis X. The plurality of holes 30b extend from the gas path 30a to the processing space S. In an exemplary embodiment, the plasma processing device 10 may be further provided with a gas supply system 32, and the gas supply system 32 is connected to the gas path 30a.

The gas supply system 32 may include a gas source 32a, a valve 32b and a flow controller 32c. The gas source 32a is a gas source of the first process gas. As for the first process gas, for example, a silicon atom-containing gas such as aminosilane, for example, BTBAS [bis(tert-butylamino)silane] may be used. The valve 32b is connected to the gas source 32a, and switches supplying of the gas from the gas source 32a and stopping the supplying. The flow controller 32c is, for example, a mass flow controller, and controls the flow rate of the first process gas to the processing space S.

Figure 2B:
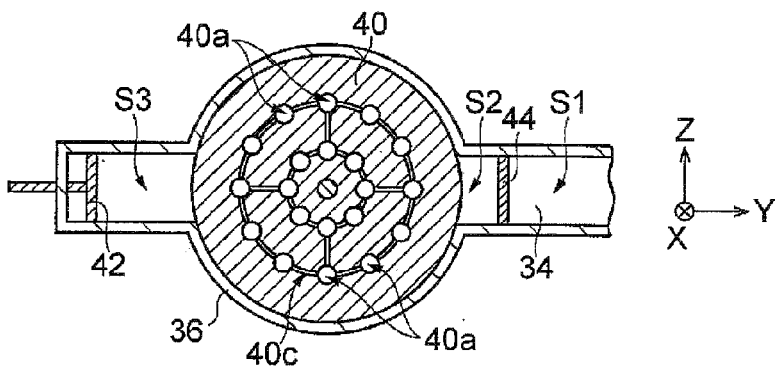
Figure 2C:
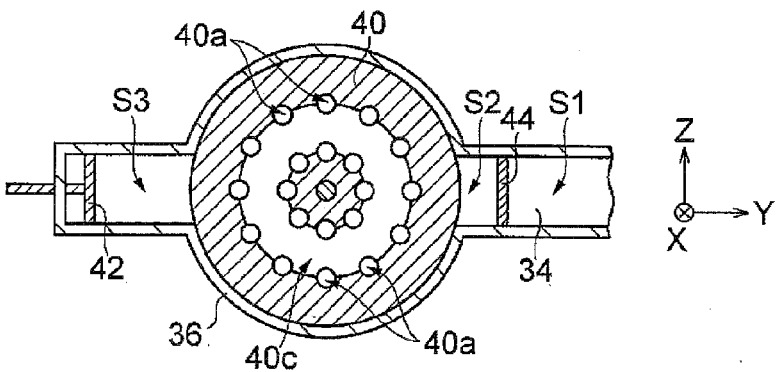

A structure configured to introduce microwaves to the plasma generation space is provided right above the top plate portion 20. Hereinafter, FIG. 1 together with FIG. 2A will be referred to. FIGS. 2A to 2C illustrate cross-sectional views along the line II-II of FIG. 1.

As illustrated in FIGS. 1 and 2A, the plasma processing device 10 may be further provided with an upper plate portion 34 and a side plate portion 36. The upper plate portion 34 and the side plate portion 36 are also electrically conductive. The upper plate portion 34 is provided above the top plate portion 20 to be spaced apart from the top plate portion 20, and extend along the plane that intersects the axis X. The side plate portion 36 extends in the axis X direction to connect the upper plate portion 34 to the top plate portion 20.

The top plate portion 20, the upper plate portion 34 and the side plate portion 36 define spaces S1, S2 and S3. The space S2 is formed between the space S1 and the space S3 in the Y direction that intersects the axis X direction.

The top plate portion 20, the upper plate portion 34 and the side plate portion 36 constitute a rectangular waveguide that has the space Si as an inner space. In an exemplary embodiment, the plasma processing device 10 may be further provided with a microwave generator 38, and the microwave generator 38 is connected to the rectangular waveguide. The microwave generator 38 supplies microwaves, for example, at 500 MHz, to the rectangular waveguide.

The space S2 is a substantially disk-shaped space. The plasma processing device 10 is further provided with a dielectric member 40, and the dielectric member 40 is provided within the space S2. A plunger 42 that is movable in the Y direction is provided in the space S3. A bump 44 is provided in the space S1. The plunger 42 and the bump 44 confront each other in the Y direction such that the dielectric member 40 is interposed therebetween. The plunger 42 and the bump 44 are made of a metal, and standing waves are generated between the plunger 42 and the bump 44. The standing waves (microwaves) generated in this manner are introduced to the dielectric member 40 accommodated in the space S2.

The dielectric member 40 is a substantially disk-shaped member. The dielectric member 40 is made of a dielectric material such as, for example, quartz. A plurality of cavities 40a are formed in the dielectric member 40. In an exemplary embodiment, the cavities 40a may have a cylindrical shape that extends in the axis X direction. The cavities 40a may be arranged along a plurality of concentric circles around the axis X. In an exemplary embodiment, as illustrated in FIG. 2A, the plurality of cavities 40a are arranged along two concentric circles around the axis X. For example, the cavities 40a may have a diameter of 10 mm to 30 mm, and a depth of 10 mm to 30 mm (length in the axis X direction).

A plurality of holes 46a are connected to the plurality of cavities 40a, respectively. The plurality of holes 46a are formed over the dielectric member 40 and the upper plate portion 34. The plurality of holes 46a are connected to a common gas path 46b that is formed in the upper plate portion 34. The plurality of holes 46a and the gas path 46b constitute a second gas supply unit 46. The second gas supply unit 46 supplies a second process gas to the cavities 40a.

The second process gas is a gas for plasma processing. The second process gas is used to denature an atomic layer that is adsorbed on the substrate to be processed W by the supply of the first process gas. For example, the second process gas may include NH$_3$ gas or nitrogen gas in order to nitride the atomic layer. The second process gas may include oxygen gas in order to oxidize the atomic layer.

The second gas supply unit 46 is connected to a gas supply system 48. The gas supply system 48 may include a gas source 48a, a valve 48b and a flow controller 48c. The gas source 48a is a gas source of the second process gas. The valve 48b is connected to the gas source 48a, and switches supplying of the second process gas and stopping the supplying. The flow controller 48c is, for example, a mass flow controller and switches the supply amount of the second process gas.

In an exemplary embodiment, a gas supply system 50 may be further connected to the second gas supply unit 46. The gas supply system 50 may include a gas source 50a, a valve 50b and a flow controller 50c. The gas source 50a is a gas source of an inert gas such as, for example, argon. The valve 50b is connected to the gas source 50a, and switches supplying of the inert gas and stopping the supplying. The flow controller 50c is, for example, a mass flow controller, and switches the supply amount of the inert gas.

Referring to FIG. 1, a plurality of through holes 20a are formed in the top plate portion 20. The plurality of through holes 20a connect the plurality of cavities 40a to the processing space S, respectively. The through holes 20a extend from the bottom surface (first surface) 20b of the top plate portion 20 to the top surface (second surface) 20c. The top surface 20c is opposite to the bottom surface 20b. The bottom surface 20b faces the processing space S. On the top surface 20c, the dielectric member 40 is placed to be in contact with the top surface 20c.

In the plasma processing device 10 as configured above, the second process gas is supplied to the cavities 40a of the dielectric member 40. The cavities 40a of the dielectric member 40 are supplied with the microwaves, and plasma is generated in the cavities 40a. Accordingly, the second process gas is activated and radicals are generated within the cavities 40a. The cavities 40a, that is, the plasma generation spaces, are separated from the processing space S by the top plate portion 20. The top plate portion 20 is electrically conductive, and thus, serves as a masking portion of the plasma generated in the cavities 40a. In the plasma processing device 10, the plasma generation space is separated from the processing space S by such a masking portion, and thus the capacity of the processing space S, especially, the distance from the masking portion to the stage 14 may be reduced.

Then, the radicals are supplied from the cavities 40a into the processing space S via the through holes 20a. Since the cavities 40a are formed right above the masking portion (top plate portion 20) in the plasma processing device 10, the distance between the processing space S and the cavities 40a is short. Accordingly, the radicals generated in the cavities 40a may be supplied to the processing space S while being suppressed from being deactivated. Thus, the plasma processing device 10 may shorten the time for plasma processing.

As described above, the distance from the masking portion to the stage 14, that is, the length in the axis X direction of the processing space S may be shortened. For example, the length in the axis X direction of the processing space S may be set to range from 5 mm to 40 mm. That is, the distance of the axis X direction between the stage 14 and the top plate portion 20 constituting the masking portion may be set such that the distance in the axis X direction between the bottom surface (first surface) 20b and the placing surface (top surface) of the stage 14 on which the substrate to be processed W is placed ranges from 5 mm to 40 mm. Such setting of the length in the axis X direction of the processing space S may further shorten the time for plasma processing.

Hereinafter, an ALD method as an exemplary embodiment of a plasma processing method using the plasma processing device 10 will be described. In the method according to the exemplary embodiment, first, the substrate to be processed W is placed on the stage 14.

Subsequently, a first processing process is carried out. In the first processing process, the first process gas is supplied to the processing space S. In this process, the valve 32b is opened, and the flow rate of the first process gas is controlled by the flow controller 32c. Accordingly, a layer that includes atoms or molecules of a raw material contained in the first process gas is adsorbed on the substrate to be processed W. In the first processing process, an unnecessary gas is exhausted by the exhaust device 26. The pressure of the processing space S in this process is, for example, 5 Torr (666.5 Pa). After this process is completed, the valve 32b is closed.

Subsequently, a first purging/exhausting process is carried out. In the first purging/exhausting process, if necessary, the purge gas is supplied to the processing space S and exhaust of the processing space S is performed. In this process, the valve 28b is opened, and the supply amount of the purge gas is controlled by the flow controller 28c. Also, exhaust is performed by the exhaust device 26. The purge gas may be supplied from the gas source 50a via the valve 50b through flow rate control by the flow controller 50c.

In the first purging/exhausting process, an unnecessary portion (a gas component) except that the layer formed in the first processing process is removed. By this process, a portion of the layer formed in the first processing process which is chemisorbed on the substrate to be processed W (for example, a single molecular layer or a single atomic layer) remains, and the remainder of the layer formed in the first processing process which is physisorbed or chemisorbed on the substrate to be processed W (a gas component) is removed. Also, by this process, the atmosphere within the processing space S is substituted with the inert gas. As described above, since the capacity of the processing space S is small, the substitution may be completed within a relatively short time.

Subsequently, a second processing process is carried out. In the second processing process, microwaves are generated by the microwave generator 38, and the second process gas is supplied into the cavities 40a. The second process gas is supplied into the cavities 40a while opening the valve 48b, and controlling the flow rate by the flow controller 48c. In this process, the inert gas may be supplied from the gas supply system 50. The pressure of the processing space S in this process is, for example, 5 Torr (666.5 Pa).

In the second processing process, plasma is generated within the cavities 40a by microwaves. Accordingly, the second process gas supplied into the cavities 40a is activated, and radicals are generated. The generated radicals are supplied to the processing space S to nitride or oxidize the layer deposited on the substrate to be processed W.

Subsequently, a second purging/exhausting process is carried out. In the second purging/exhausting process, if necessary, the purge gas is supplied to the processing space S and exhaust of the processing space S is performed. In this process, the valve 28b is opened, and the supply amount of the purge gas is controlled by the flow controller 28c. Also, exhaust is performed by the exhaust device 26. The purge gas may be supplied from the gas source 50a via the valve 50b through flow rate control by the flow controller 50c. By this second purging/exhausting process, the atmosphere within the processing space S is substituted with the inert gas. As described above, since the capacity of the processing space S is small, the substitution may be completed within a relatively short time.

In the plasma processing method according to an exemplary embodiment, the first processing process, the first purging/exhausting process, the second processing process and the second purging/exhausting process are repeated a predetermined number of times. Accordingly, an oxidized or nitrided atomic or molecular layer is formed on the substrate to be processed.

Figure 3:
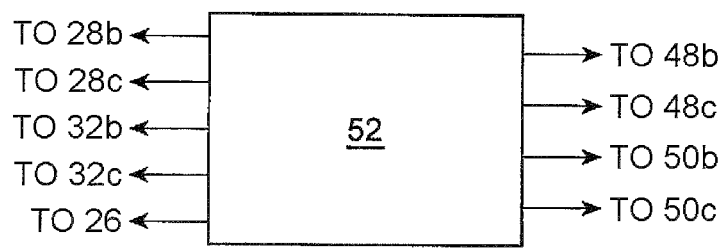
FIG. 3 is a view illustrating a control unit which may be employed in the plasma processing device according to an exemplary embodiment.

In order to realize the plasma processing method according to the exemplary embodiment as described above, the plasma processing device 10 may be further provided with a control unit. FIG. 3 is a view illustrating a control unit which may be employed in the plasma processing device according to an exemplary embodiment. The control unit 52 as illustrated in FIG. 3 may be, for example, a computer that has a central processing unit (CPU) and a memory. In this case, in the control unit 52, the CPU outputs various control signals in accordance with a program stored in the memory.

The various control signals output by the control unit 52 are output to, for example, the exhaust device 26, the valve 28b, the flow controller 28c, the valve 32b, the flow controller 32c, the valve 48b, the flow controller 48c, the valve 50b, and the flow controller 50c. Accordingly, the exhaust device 26, the valve 28b, the flow controller 28c, the valve 32b, the flow controller 32c, the valve 48b, the flow controller 48c, the valve 50b, and the flow controller 50c are controlled to shift to the states in the first processing process, the first purging/exhausting process, the second processing process and the second purging/exhausting process as described above.

Hereinafter, other exemplary embodiments will be described. As illustrated in FIG. 2B, a communication path 40c that makes two cavities 40a communicate with each other may be formed in the dielectric member 40. The communication path 40c is, for example, a groove that is formed between the two cavities 40a in the dielectric member 40. The communication path 40c equally supplies a gas to the cavities 40a, and thus contributes to uniform generation of plasma within the two or more communicating cavities 40a. As illustrated in FIG. 2B, all of the cavities 40a may be made to communicate with each other by a plurality of communication paths 40c, but the number of the communicating cavities 40a is optional.

As illustrated in FIG. 2C, the communication path 40c may be an annular groove which is formed over an interval between two concentric circles. More specifically, in the exemplary embodiment illustrated in FIG. 2C, the plurality of cavities 40a are arranged along the two concentric circles. The annular communication path 40c is formed over an interval between the two concentric circles, and its depth in the axis X direction is set to be smaller than the depth in the axis X direction of the plurality of cavities 40a. The plurality of cavities 40a may communicate with each other by the communication path 40c.

Figure 4A:
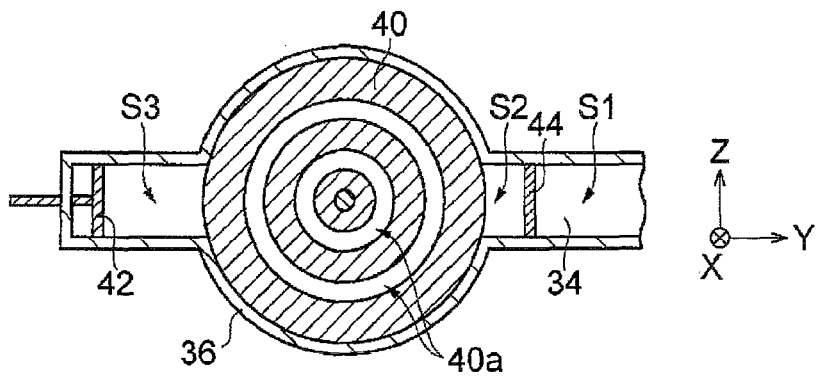
FIGS. 4A to 4C illustrate dielectric members according to other exemplary embodiments.
Figure 4B:
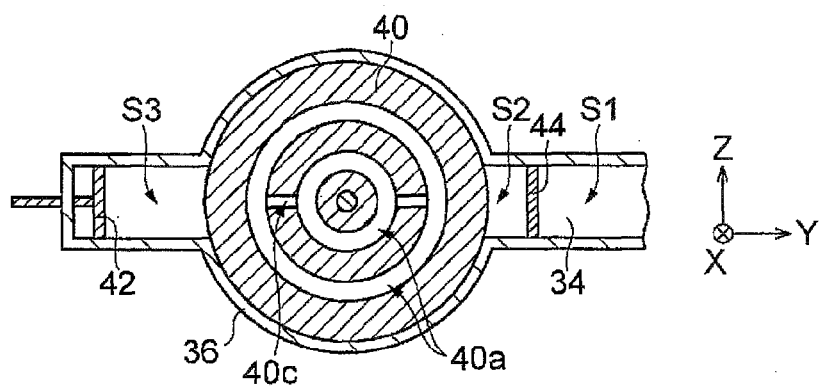
Figure 4C:
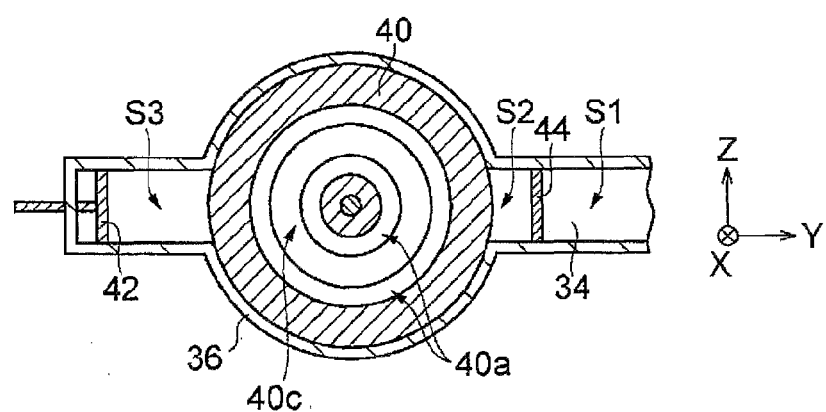

Hereinafter, FIGS. 4A to 4C will be referred to. FIGS. 4A to 4C illustrate dielectric members according to other exemplary embodiments. As illustrated in FIG. 4A, the cavities 40a formed in the dielectric member 40 may be annular grooves that are formed along a plurality of concentric circles around the axis X. The annular grooves, for example, may have a width ranging from 10 mm to 30 mm, and a depth ranging from 10 mm to 30 mm. As illustrated in FIG. 4B, the plurality of cavities 40a configured as the annular grooves may communicate with each other through the communication path 40c.

As illustrated in FIG. 4C, the communication path 40c may be an annular groove which is formed over an interval between the two concentric annular cavities 40a. In the exemplary embodiment illustrated in FIG. 4C, the depth in the axis X direction of the communication path 40c is set to be smaller than the depth in the axis X direction of the cavities 40a. The two annular cavities 40a may communicate with each other through the communication path 40c.

Figure 5:
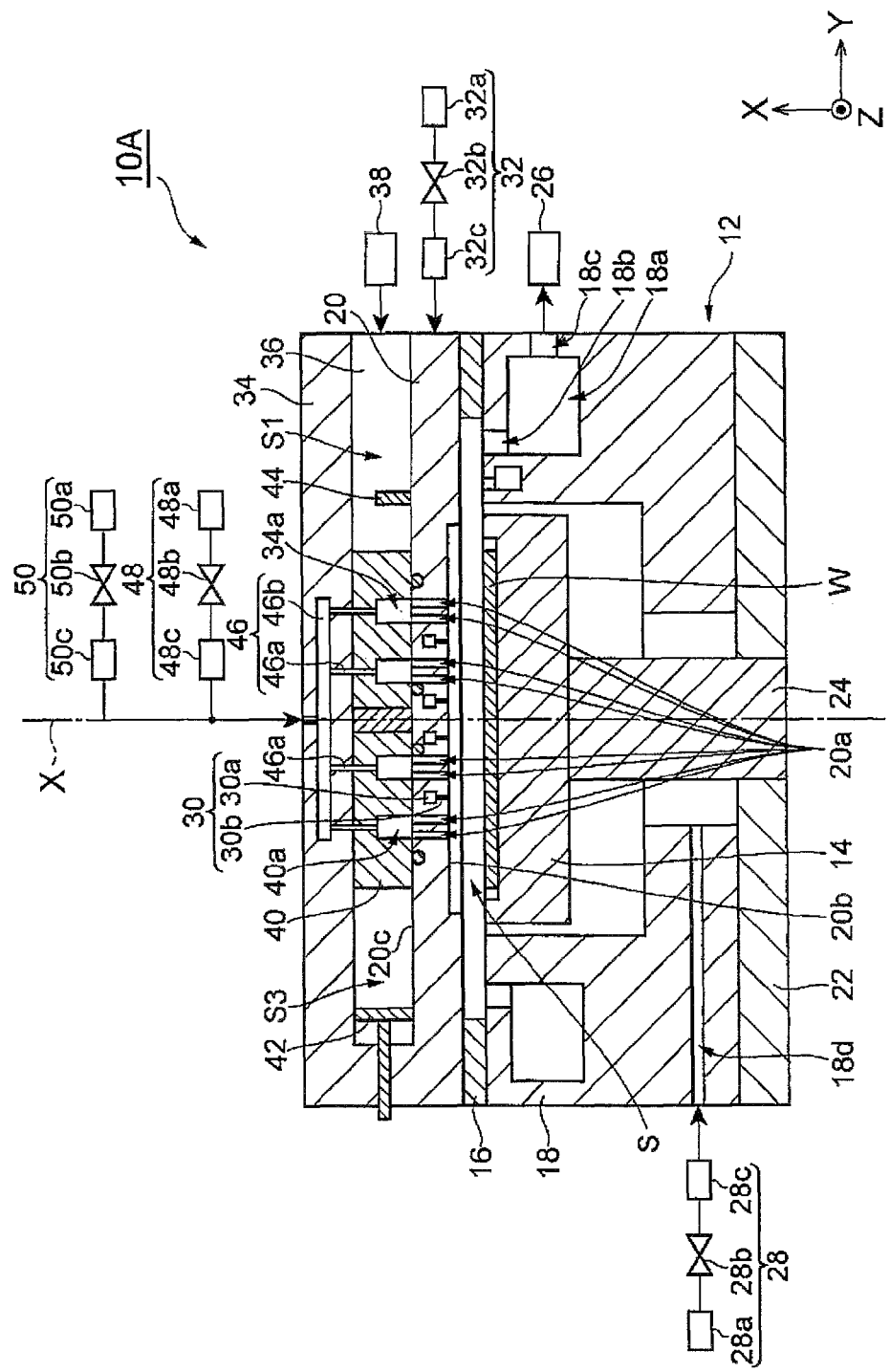
FIG. 5 is a view schematically illustrating a plasma processing device according to another exemplary embodiment.

Hereinafter, FIG. 5 will be referred to. FIG. 5 is a view illustrating a plasma processing device according to another exemplary embodiment. The plasma processing device 10A illustrated in FIG. 5 is different from the plasma processing device 10 in that a plurality of through holes 20a are connected to one cavity 40a. In the plasma processing device 10A, the cross-sectional area of the through hole 20a is smaller than the cross-sectional area of the cavity 40a. The term "cross-sectional area" means an area of the cavity 40a or an area of the through hole 20a in the plane perpendicular to the axis X direction.

In the plasma processing device 10A, the conductance of each through hole 20a is reduced. Accordingly, inflow of the first process gas into the cavities 40a may be suppressed, and plasma may be more securely suppressed from being leaked from the cavities 40a to the processing space. Meanwhile, since one cavity 40a is connected to a plurality of through holes 20a, the amount of radicals to be supplied to the processing space may be maintained. In order to reduce the conductance between the processing space S and the cavity 40a, the cavity 40a may have a tapered shape of which the area becomes smaller toward the downside.

Figure 6:
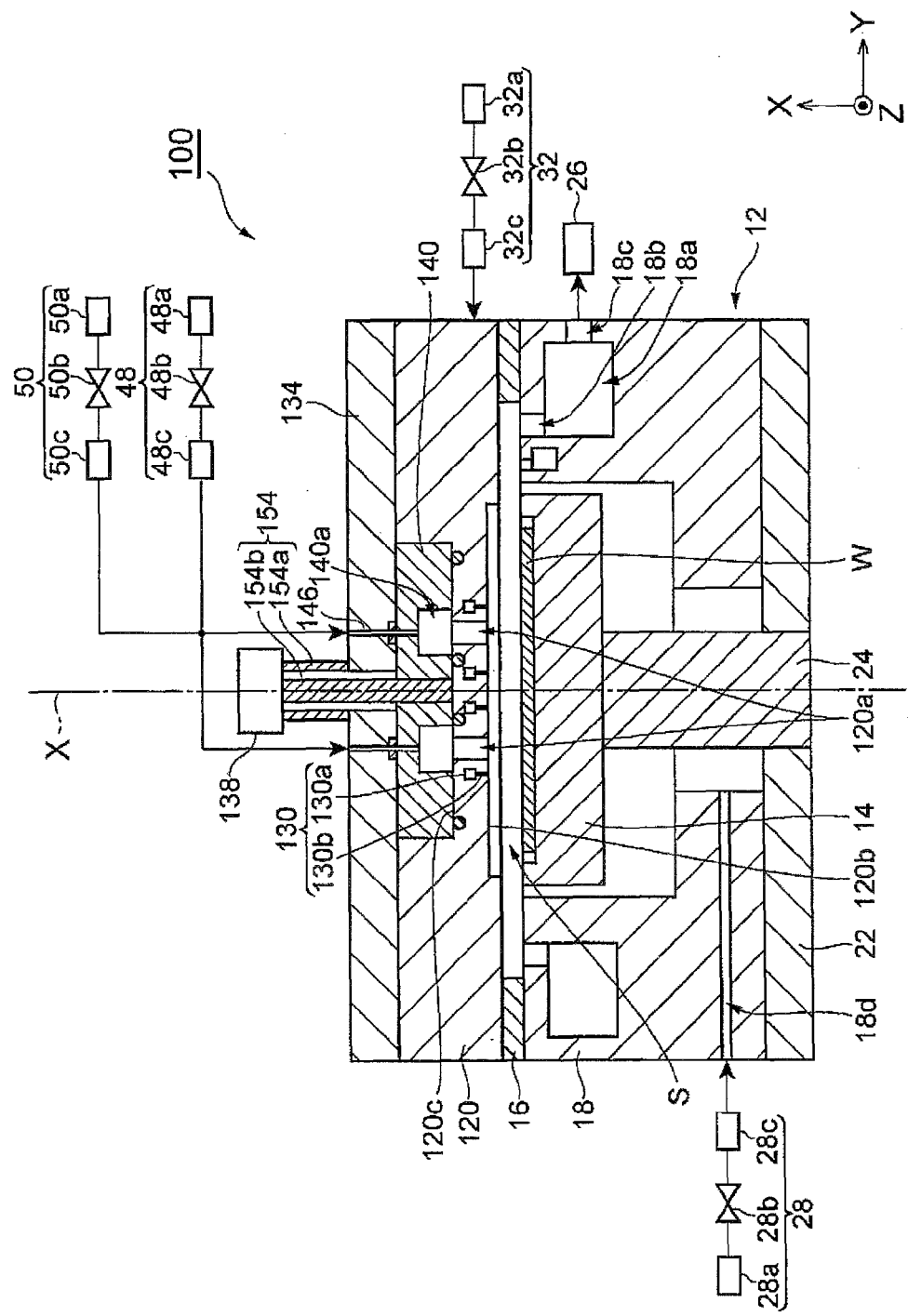
FIG. 6 is a view schematically illustrating a plasma processing device according to still another exemplary embodiment.

Hereinafter, FIG. 6 will be referred to. FIG. 6 is a view schematically illustrating a plasma processing device according to still another exemplary embodiment. The plasma processing device 100 illustrated in FIG. 6 is different from the plasma processing device 10 in that a coaxial waveguide 154 is provided as a means for introducing microwaves. The plasma processing device 100 is provided with a top plate portion 120, an upper plate portion 134, and a dielectric member 140 instead of the top plate portion 20, the upper plate portion 34 and the dielectric member 40.

The top plate portion 120 is provided right above the first side wall 16. The top plate portion 120 defines the processing space S at the top of the processing space S. The top plate portion 120 is electrically conductive, and serves as a masking portion.

In the top plate portion 120, a first gas supply unit 130 is formed. The first gas supply unit 130 may include a gas path 130a and a plurality of holes 130b. The gas path 130a may extend along an annular closed curve around the axis X. The plurality of holes 130b extend from the gas path 130a to the processing space S. The gas supply system 32 is connected to the gas path 130a.

The upper plate portion 134 is made of a metal, and provided on the top plate portion 120. The upper plate portion 134 and the top plate portion 120 define a substantially disk-shaped space therebetween. The space follows the axis X, and the dielectric member 140 is accommodated in the space.

A cavity 140a is formed in the dielectric member 140. The cavity 140a may be at least one annular groove, or at least one columnar space. The cavity 140a is connected to the processing space S via through holes 120a. The through holes 120a extend from a bottom surface 120b of the top plate portion 120 to the top surface 120c. The dielectric member 140 is placed on the top plate portion 120 to be in contact with the top surface 120c.

A second gas supply unit 146 is connected to the cavity 140a. The second gas supply unit 146 is formed over the upper plate portion 134 and the dielectric member 140, and constitutes a supply path of a second process gas. The gas supply system 48 or 50 is connected to the second gas supply unit 146.

The coaxial waveguide 154 includes an outer conductor 154a and an inner conductor 154b. The outer conductor 154a is a tubular conductor that extends along the axis X. One end of the outer conductor 154a is connected to a microwave generator 138, and the other end is connected to the upper plate portion 134. The inner conductor 154b is a conductor that extends along the axis X, and passes through the inner hole of the outer conductor 154a. One end of the inner conductor 154b is connected to the microwave generator 138, and the other end penetrates the upper plate portion 134 and the dielectric member 140 to be connected to the top plate portion 120.

In the plasma processing device 100, microwaves generated by the microwave generator 138 are supplied to the dielectric member 140 via the coaxial waveguide 154. The dielectric member 140 serves as a so-called slow wave plate. The microwaves supplied to the dielectric member 140 generate plasma within the cavity 140a. Accordingly, the second process gas supplied into the cavity 140a is activated, and radicals are generated within the cavity 140a. The generated radicals are supplied to the processing space S via the through holes 120a. The plasma processing device 100 may be also used in an ALD method like the plasma processing device 10.

Figure 7:
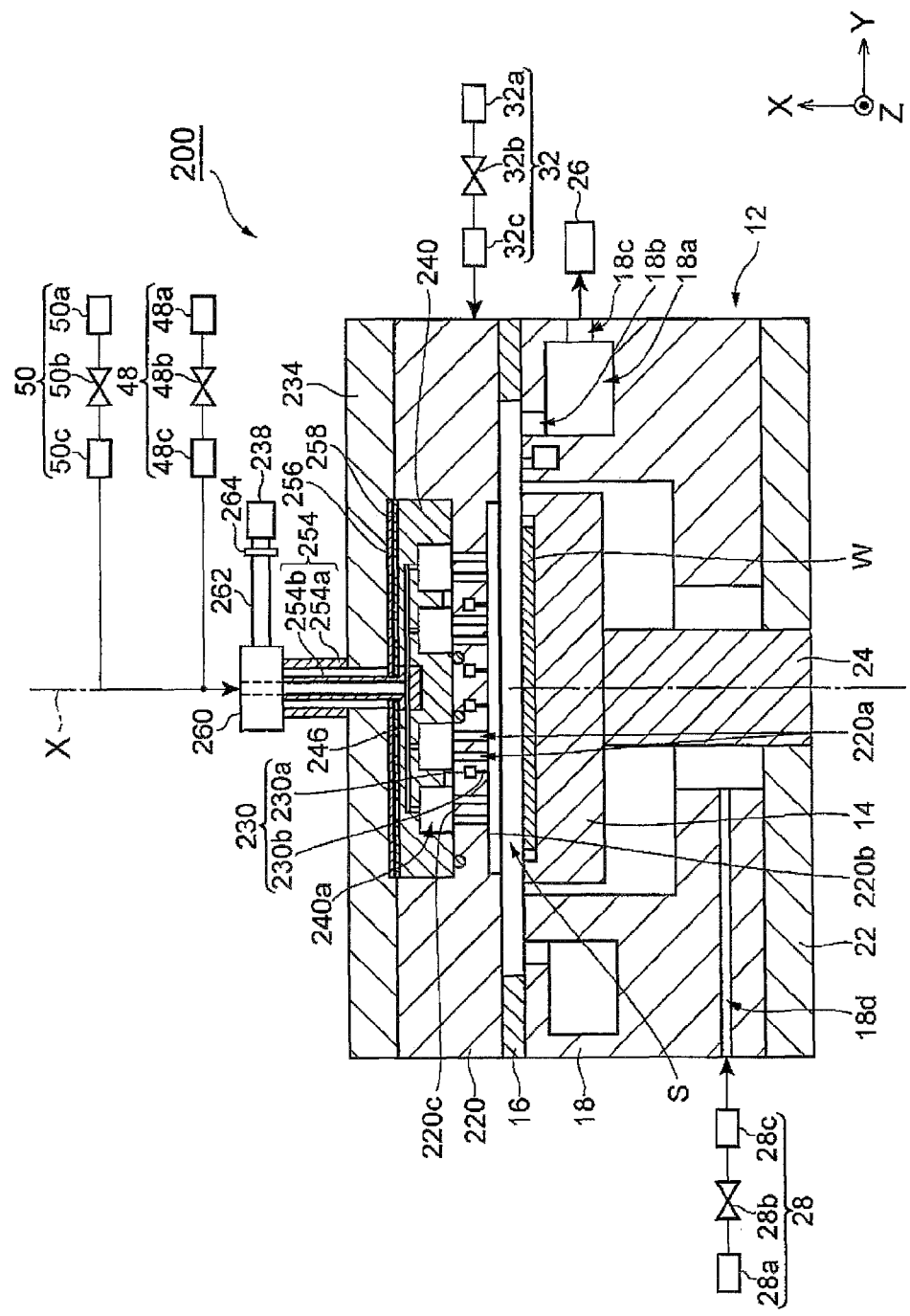
FIG. 7 is a view schematically illustrating a plasma processing device according to yet another exemplary embodiment.

Hereinafter, FIG. 7 will be referred to. FIG. 7 is a view schematically illustrating a plasma processing device according to yet another exemplary embodiment. The plasma processing device 200 illustrated in FIG. 7 is different from the plasma processing device 10 in that a coaxial waveguide 254, a dielectric plate 256 and a slot plate 258 are provided. Further, the plasma processing device 200 is provided with a top plate portion 220, an upper plate portion 234, and a dielectric member 240 instead of the top plate portion 20, the upper plate portion 34 and the dielectric member 40.

The top plate portion 220 is provided right above the first side wall 16. The top plate portion 220 defines the processing space S at the top of the processing space. The top plate portion 220 is electrically conductive, and serves as a masking portion. In the top plate portion 220, a first gas supply unit 230 is formed. The first gas supply unit 230 may include a gas path 230a and a plurality of holes 230b. The gas path 230a may extend along an annular closed curve around the axis X. The plurality of holes 230b extend from the gas path 230a to the processing space S. The gas supply system 32 is connected to the gas path 230a.

The upper plate portion 234 is made of a metal, and provided on the top plate portion 220. The upper plate portion 234 and the top plate portion 220 define a substantially disk-shaped space therebetween. The space is along the axis X, and the dielectric member 240, the dielectric plate 256 and the slot plate 258 are accommodated in the space.

The slot plate 258 is a substantially disk-shaped conductor. On the slot plate 258, a plurality of slot pairs are formed. Each slot pair includes two slots extending to intersect or to cross at right angles. The slot pairs are disposed at a predetermined interval in the radial direction around the axis X, and disposed at a predetermined interval in the circumferential direction. The dielectric plate 256 is provided between the slot plate 258 and the upper plate portion 234. The slot plate 258, the upper plate portion 234, and the dielectric plate 256 constitute a radial line slot antenna.

The coaxial waveguide 254 includes an outer conductor 254a and an inner conductor 254b. The outer conductor 254a is a tubular conductor that extends along the axis X. One end of the outer conductor 254a is connected to a mode converter 260.

The mode converter 260 is connected to a microwave generator 238 via a waveguide 262 and a tuner 264. The other end of the outer conductor 254a is connected to the upper plate portion 234.

The inner conductor 254b is a tubular conductor that extends along the axis X, and passes through the inner hole of the outer conductor 254a. One end of the inner conductor 254b is connected to the mode converter 260, and the other end penetrates the upper plate portion 234 and the dielectric plate 256 to be connected to the slot plate 258.

The dielectric member 240 is provided between the slot plate 258, and a top surface 220c of the top plate portion 220. The dielectric member 240 has a function as a so-called dielectric window. A cavity 240a is formed in the dielectric member 240. The cavity 240a may be at least one annular groove, or at least one columnar space. The cavity 240a is connected to the processing space S via through holes 220a. The through holes 220a extend from a bottom surface 220b of the top plate portion 220 to the top surface 220c. The dielectric member 240 is placed on the top plate portion 220 to be in contact with the top surface 220c.

A second gas supply unit 246 is connected to the cavity 240a. The second gas supply unit 246 is formed within the dielectric member 240. The gas supply system 48 or 50 is connected to the second gas supply unit 246 via an inner hole of the inner conductor 254b.

In the plasma processing device 200, microwaves supplied to the dielectric member 240 generate plasma within the cavity 240a. Accordingly, a second process gas supplied into the cavity 240a is activated, and radicals are generated within the cavity 240a. The generated radicals are supplied to the processing space S via the through holes 220a. The plasma processing device 200 may be also used in an ALD method like the plasma processing device 10.

Figure 8:
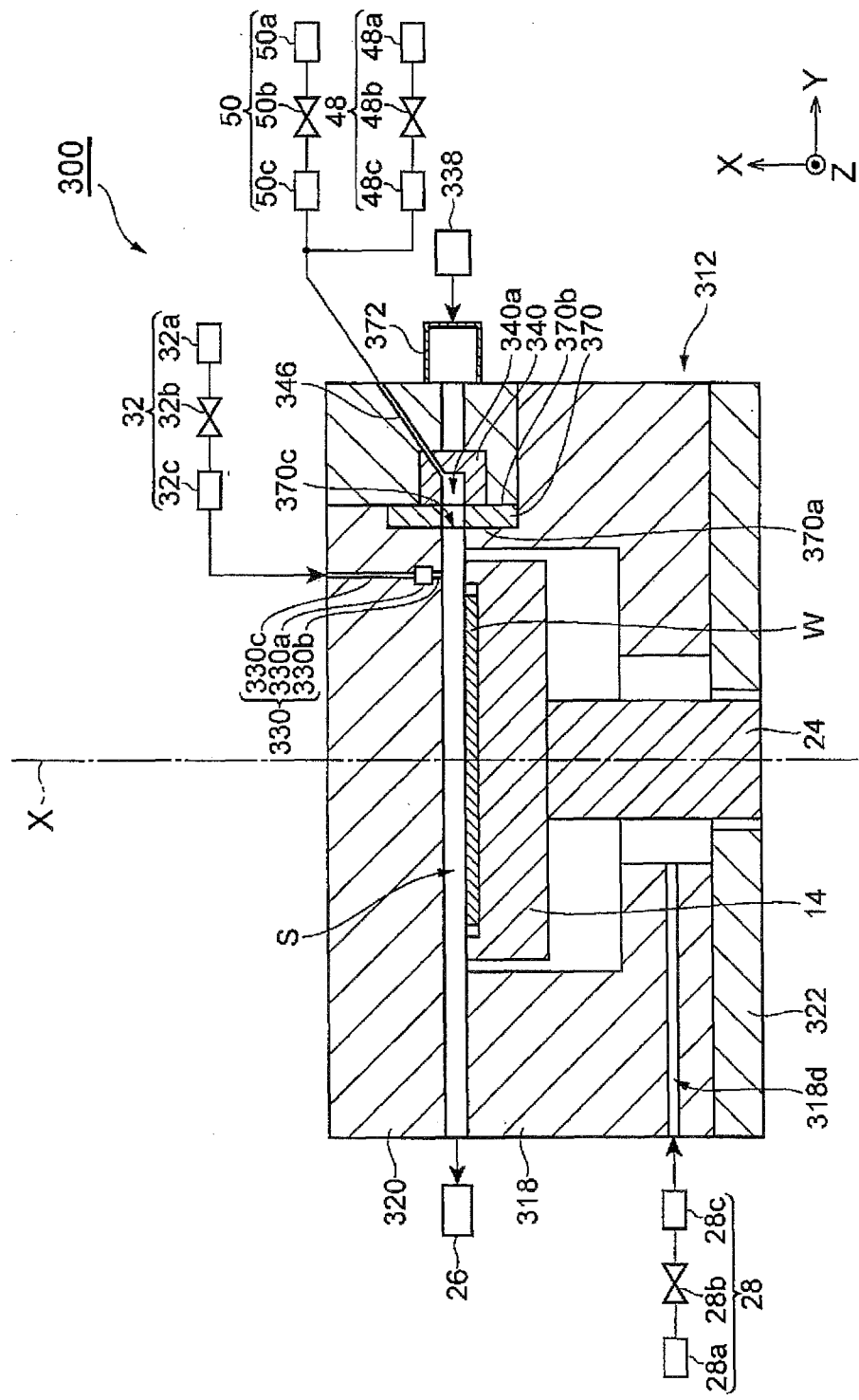
FIG. 8 is a view schematically illustrating a plasma processing device according to a still further exemplary embodiment.

Hereinafter, FIG. 8 will be referred to. A plasma processing device 300 illustrated in FIG. 8 is provided with a processing vessel 312 and the stage 14. The processing vessel 312 defines the processing space S. The processing vessel 312 is made of a metal, and includes a side wall 318, a top plate portion 320 and a bottom portion 322. The side wall 318 has a substantially cylindrical shape that extends along the axis X. The upper end opening of the side wall 318 is closed by the top plate portion 320. A bottom portion 322 is provided at the lower end of the side wall 318. The stage 14 is provided in the inside space of the side wall 318, and is held by the post 24 provided below the stage 14. The processing space S exists above the stage 14.

The processing space S is connected to the exhaust device 26 provided at the outside of the processing vessel 312. A gas path 318d is formed in the side wall 318. The gas supply system 28 is connected to the gas path 318d.

A first gas supply unit 330 is formed in the top plate portion 320. The first gas supply unit 330 includes a space 330a formed within the top plate portion 320, a hole 330b that connects the space 330a to the processing space S, and a gas path 330c that connects the space 330a to the outside of the processing vessel 312. The gas supply system 32 is connected to the gas path 330c.

Figure 9:
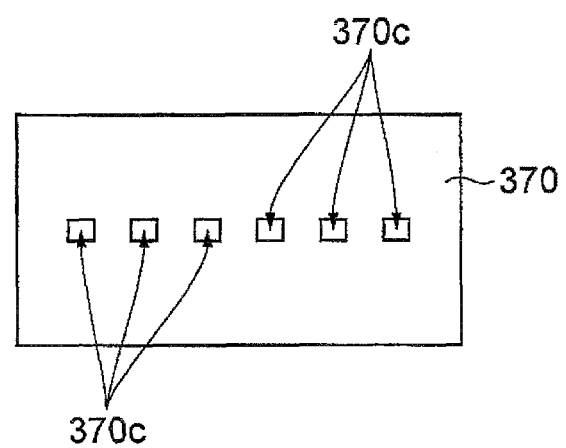
FIG. 9 is a plan view illustrating a masking portion of the plasma processing device illustrated in FIG. 8.

In the plasma processing device 300, a masking portion 370 and a dielectric member 340 are provided in the lateral direction of the processing space S, that is, in the direction crossing the axis X with respect to the processing space S. FIG. 9 is a plan view illustrating a masking portion of the plasma processing device illustrated in FIG. 8. Hereinafter, description will be made with reference to FIG. 9 together with FIG. 8.

The masking portion 370 is electrically conductive and has a flat plate shape. The masking portion 370 includes a first surface 370a and a second surface 370b. The first surface 370a faces the processing space S. The distance between the first surface 370a and the stage 14 may be set such that, for example, the shortest distance (distance in the Y direction) between the first surface 370a and the edge of the substrate to be processed W placed on the stage 14 ranges from 5 mm to 60 mm. Through such setting of the distance, the processing time for plasma processing may be further shortened.

The second surface 370b is a surface at the opposite side of the first surface 370a. Through holes 370c that extend from the first surface 370a to the second surface 370b are formed in the masking portion 370. In an exemplary embodiment, a plurality of through holes 370c are formed in the masking portion 370. The dielectric member 340 is provided to be in contact with the second surface 370b of the masking portion 370.

The dielectric member 340 is provided at the outside of the masking portion 370 with respect to the axis X. A cavity 340a is formed in the dielectric member 340. The cavity 340a communicates with the processing space S via the through holes 370c.

The dielectric member 340 and the masking portion 370 are embedded within the side wall 318 and the top plate portion 320.

A second gas supply unit 346 that is connected to the cavity 340a of the dielectric member 340 is formed in the processing vessel 312. The second gas supply unit 346 may be a gas path formed in the processing vessel 312. The gas supply system 48 or 50 is connected to the second gas supply unit 346.

As illustrated in FIG. 8, a waveguide 372 is attached to the outer surface of the processing vessel 312. A microwave generator 338 is connected to the waveguide 372. Microwaves generated by the microwave generator 338 are introduced to the cavity 340a of the dielectric member 340 via the waveguide 372 and the dielectric member 340. A second process gas is supplied to the cavity 340a. Accordingly, in the cavity 340a, the second process gas is activated, and radicals are generated. The generated radicals are supplied to the processing space S.

Also, in the plasma processing device 300, the distance between the cavity 340a and the processing space S is set to be short. Accordingly, the radicals may be supplied to the processing space S while suppressing the amount to be deactivated. Thus, the plasma processing device 300 may also shorten the processing time of plasma processing (second processing process).

Figure 10:
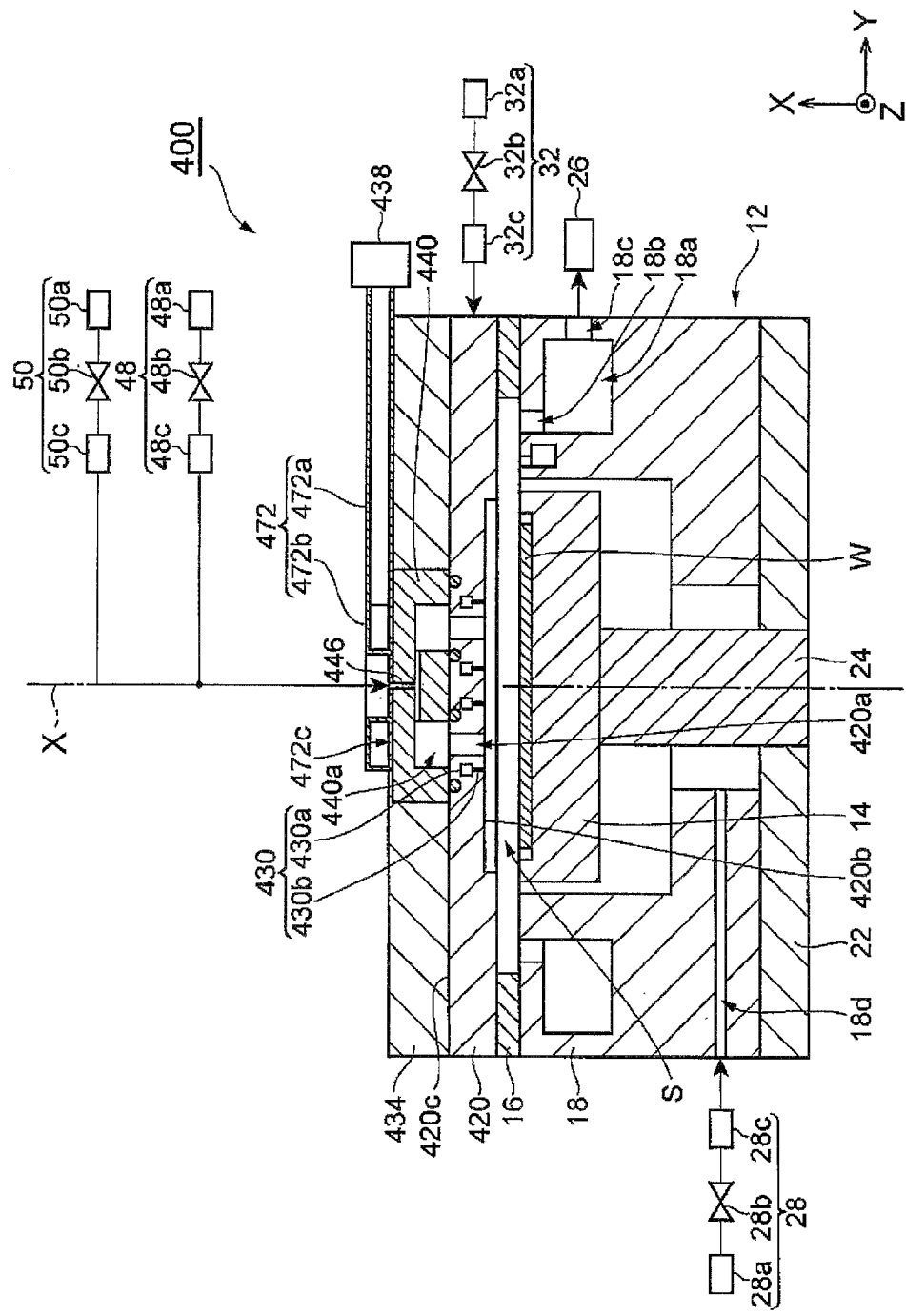
FIG. 10 is a view schematically illustrating a plasma processing device according to yet another further exemplary embodiment.

Hereinafter, FIG. 10 will be referred to. FIG. 10 is a view schematically illustrating a plasma processing device according to yet another further exemplary embodiment. The plasma processing device 400 illustrated in FIG. 10 is provided with a waveguide 472 as a means for introducing microwaves. Further, the plasma processing device 400 is provided with a top plate portion 420 and a dielectric member 440 instead of the top plate portion 20 and the dielectric member 40.

The top plate portion 420 is provided right above the first side wall 16. The top plate portion 420 defines the processing space S at the top of the processing space S. The top plate portion 420 is electrically conductive, and serves as a masking portion. In the top plate portion 420, a first gas supply unit 430 is formed. The first gas supply unit 430 may include a gas path 430a and a plurality of holes 430b. The gas path 430a may extend along an annular closed curve around the axis X. The plurality of holes 430b extend from the gas path 430a to the processing space S. The gas supply system 32 is connected to the gas path 430a.

The plasma processing device 400 is further provided with an upper plate portion 434. The upper plate portion 434 is made of a metal, and provided on the top plate portion 420. The upper plate portion 434 and the top plate portion 420 define a substantially disk-shaped space therebetween. The space is along the axis X, and the dielectric member 440 is accommodated in the space.

A cavity 440a is formed in the dielectric member 440. The cavity 440a may be at least one annular groove, or at least one columnar space. The cavity 440a is connected to the processing space S via through holes 420a. The through holes 420a extend from a bottom surface 420b of the top plate portion 420 to the top surface 420c. The dielectric member 440 is placed on the top plate portion 420 to be in contact with the top surface 420c.

A second gas supply unit 446 is connected to the cavity 440a. The second gas supply unit 446 is formed over the upper plate portion 434 and the dielectric member 440, and constitutes a supply path of a second process gas. The gas supply system 48 or 50 is connected to the second gas supply unit 446.

The waveguide 472 is provided on the dielectric member 440. The waveguide 472 includes a first waveguide portion 472a and a second waveguide portion 472b. The first waveguide portion 472a constitutes a rectangular waveguide that extends in the direction crossing the axis X. A microwave generator 438 is connected to one end of the first waveguide portion 472a. The second waveguide portion 472b is connected to the other end of the first waveguide portion 472a.

The second waveguide portion 472b is placed on the dielectric member 440. The second waveguide portion 472b constitutes a waveguide that extends along an annular closed curve around the axis X. A plurality of slots 472c are formed in the lower wall portion of the second waveguide portion 472b. The slots 472c are arranged in the circumferential direction. In an exemplary embodiment, the slots 472c may be provided above the cavity 440a in the axis X direction. Accordingly, generation efficiency of plasma in the cavity 440a may be increased.

In the plasma processing device 400, microwaves generated by the microwave generator 438 are supplied to the dielectric member 440. The microwaves supplied to the dielectric member 440 generate plasma within the cavity 440a. Accordingly, the second process gas supplied into the cavity 440a is activated, and radicals are generated within the cavity 440a. The generated radicals are supplied to the processing space S via the through holes 420a. The plasma processing device 400 may be also used in an ALD method like the plasma processing device 10.

Figure 11:
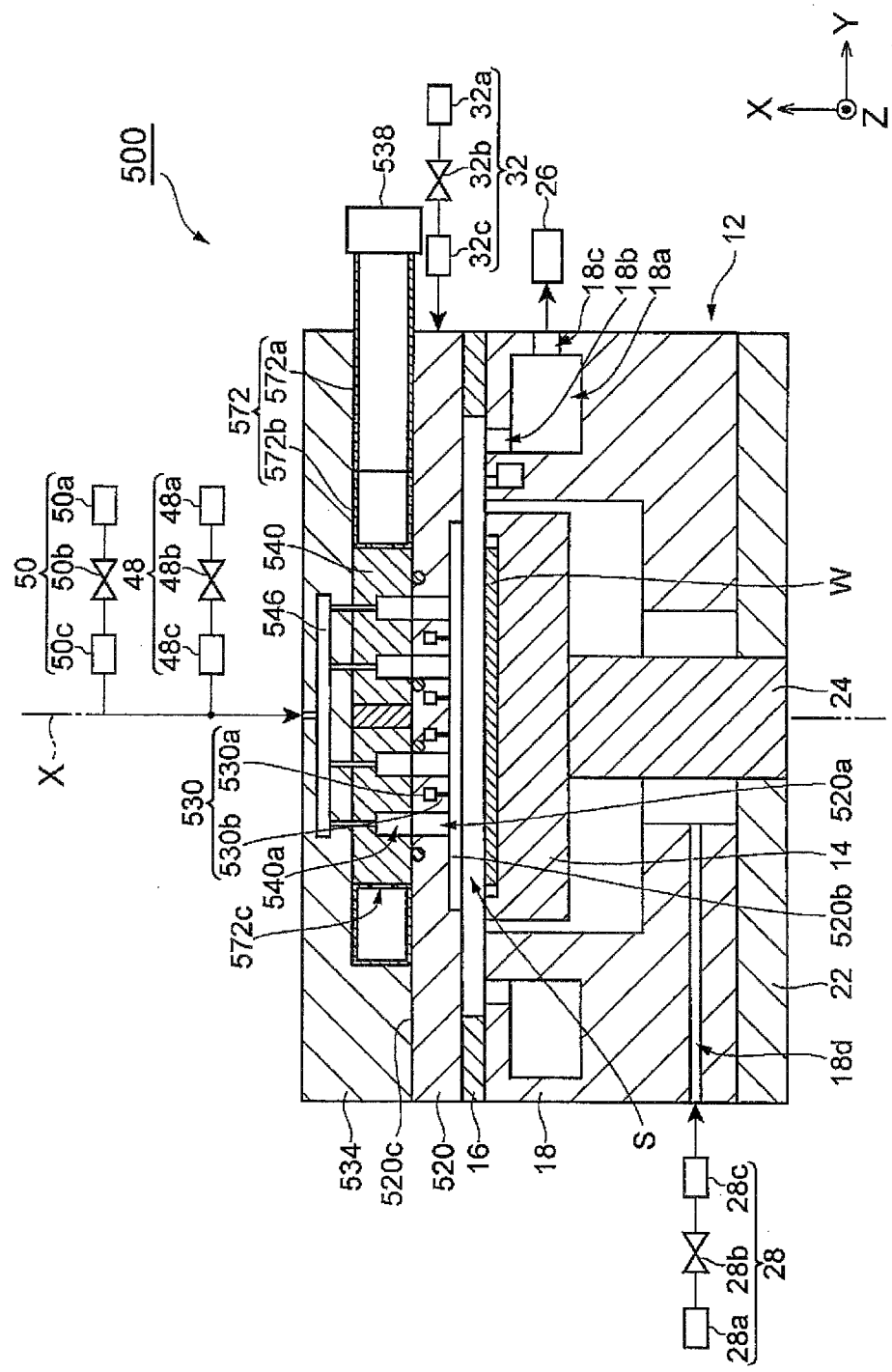
FIG. 11 is a view schematically illustrating a plasma processing device according to still yet another further exemplary embodiment.

Hereinafter, FIG. 11 will be referred to. FIG. 11 is a view schematically illustrating a plasma processing device according to still yet another further exemplary embodiment. The plasma processing device 500 illustrated in FIG. 11 is provided with a waveguide 572 as a means for introducing microwaves. Further, the plasma processing device 500 is provided with a top plate portion 520 and a dielectric member 540 instead of the top plate portion 20 and the dielectric member 40.

The top plate portion 520 is provided right above the first side wall 16. The top plate portion 520 defines the processing space S at the top of the processing space S. The top plate portion 520 is electrically conductive, and serves as a masking portion. In the top plate portion 520, a first gas supply unit 530 is formed. The first gas supply unit 530 may include a gas path 530a and a plurality of holes 530b. The gas path 530a may extend along an annular closed curve around the axis X. The plurality of holes 530b extend from the gas path 530a to the processing space S. The gas supply system 32 is connected to the gas path 530a.

The plasma processing device 500 is further provided with an upper plate portion 534. The upper plate portion 534 is made of a metal, and provided on the top plate portion 520. The upper plate portion 534 and the top plate portion 520 define a substantially disk-shaped space therebetween. The space is along the axis X, and the dielectric member 540 is accommodated in the space.

A cavity 540a is formed in the dielectric member 540. The cavity 540a may be at least one annular groove, or at least one columnar space. The cavity 540a is connected to the processing space S via through holes 520a. The through holes 520a extend from a bottom surface 520b of the top plate portion 520 to the top surface 520c. The dielectric member 540 is placed on the top plate portion 520 to be in contact with the top surface 520c.

A second gas supply unit 546 is connected to the cavity 540a. The second gas supply unit 546 is formed over the upper plate portion 534 and the dielectric member 540, and constitutes a supply path of a second process gas. The gas supply system 48 or 50 is connected to the second gas supply unit 546.

The waveguide 572 is provided on the top plate portion 520. The waveguide 572 includes a first waveguide portion 572a and a second waveguide portion 572b. The first waveguide portion 572a constitutes a rectangular waveguide that extends in the direction crossing the axis X. A microwave generator 538 is connected to one end of the first waveguide portion 572a. The second waveguide portion 572b is connected to the other end of the first waveguide portion 572a.

The second waveguide portion 572b constitutes a waveguide that extends along an annular closed curve around the axis X. The second waveguide portion 572b is provided to surround the outer peripheral surface of the dielectric member 540. A plurality of slots 572c are formed in the inner wall portion of the second waveguide portion 572b. The slots 572c are arranged in the circumferential direction.

In the plasma processing device 500, microwaves generated by the microwave generator 538 are supplied to the dielectric member 540. The microwaves supplied to the dielectric member 540 generate plasma within the cavity 540a. Accordingly, the second process gas supplied into the cavity 540a is activated, and radicals are generated within the cavity 540a. The generated radicals are supplied to the processing space S via the through holes 520a. The plasma processing device 500 may be also used in an ALD method like the plasma processing device 10.

Various exemplary embodiments have been described above, but the present disclosure is not limited to the exemplary embodiments, and various modifications thereof may be made. For example, configurations or the like of respective portions in the above-described various exemplary embodiments may be combined with each other without departing from the spirit of the present disclosure.

DESCRIPTION OF SYMBOLS

10: plasma processing device, 12: processing vessel, 14: stage, 20: masking portion (top plate portion), 20a: through holes, 20b: bottom surface (first surface), 20c: top surface (second surface), 30: first gas supply unit, 40: dielectric member, 40a: cavities, 40c: communication path, 46: second gas supply unit, S: processing space.

What is claimed is:

1. A plasma processing device, comprising:
a stage;
a processing vessel configured to define a processing space above the stage;
a first supply unit configured to supply a first process gas for layer deposition to the processing space;
a masking portion electrically conductive and including a first surface facing the processing space, a second surface opposite to the first surface, and one or more through holes;
a dielectric member provided to be in contact with the second surface of the masking portion and including one or more cavities connected to the one or more through holes;
a microwave introduction unit configured to introduce microwaves to the dielectric member; and
a second supply unit configured to supply a second process gas for plasma processing into the one or more cavities of the dielectric member,
whereby a plasma is generated in the one or more cavities,
wherein the microwave introduction unit includes a slot plate which is made of metal, and
wherein the dielectric member constitutes a dielectric window provided between the slot plate and the masking portion, the dielectric window being configured to transmit microwaves therethrough.

2. The plasma processing device of claim 1, wherein the one or more cavities are one or more columnar spaces formed in the dielectric member.

3. The plasma processing device of claim 1, wherein the one or more cavities are one or more annular grooves formed in the dielectric member.

4. The plasma processing device of claim 1, wherein the dielectric member is formed with a communication path that is configured to communicate between at least two among the plural cavities.

5. The plasma processing device of claim 1, wherein the microwave introduction unit further includes a coaxial waveguide.

6. The plasma processing device of claim 5, wherein the coaxial waveguide is coupled with the masking portion through the dielectric member.

7. The plasma processing device of claim 5, wherein the the slot plate being coupled with the coaxial waveguide and formed with a plurality of slots in a circumferential direction and a radial direction.

8. The plasma processing device of claim 1, wherein a cross-sectional area of each of the one or more through holes is smaller than a cross-sectional area of the one or more cavities.

9. The plasma processing device of claim 1, wherein the one or more through holes are plural through holes connected to one cavity.

10. The plasma processing device of claim 1, wherein a distance between a placing surface of the stage on which a substrate to be processed is placed, and the first surface ranges from 5 mm to 40 mm.

11. The plasma processing device of claim 1, wherein the masking portion and the dielectric member are provided at a lateral side of the processing space.

12. The plasma processing device of claim 11, wherein a distance between the stage and the first surface is set such that a shortest distance between the first surface and an edge of the substrate mounted on the stage ranges from 5 mm to 60 mm.

13. A plasma processing device, comprising:
a stage;
a processing vessel configured to define a processing space above the stage;
a first supply unit configured to supply a first process gas for layer deposition to the processing space;
a masking portion electrically conductive and including a first surface facing the processing space, a second surface opposite to the first surface, and one or more through holes;

a dielectric member provided on a side of the second surface of the masking portion and including one or more cavities connected to the one or more through holes;

a microwave introduction unit configured to introduce microwaves to the dielectric member; and a second supply unit configured to supply a second process gas for generating a plasma into the one or more cavities of the dielectric member, wherein the masking portion is configured to separate a plasma generating space from the processing space, to pass radicals generated in the one or more cavities to the processing space via the one or more through holes, and to shield the plasma generated in the one or more cavities against the processing space, wherein the microwave introduction unit includes a slot plate which is made of metal, and wherein the dielectric member constitutes a dielectric window provided between the slot plate and the masking portion, the dielectric window being configured to transmit microwaves therethrough.

14. A plasma processing device, comprising:

a stage;

a processing vessel configured to define a processing space above the stage;

a first supply unit configured to supply a first process gas for layer deposition to the processing space;

a masking portion electrically conductive and including a first surface facing the processing space, a second surface opposite to the first surface, and one or more through holes;

a dielectric member provided on a side of the second surface of the masking portion and including one or more cavities connected to the one or more through holes;

a microwave introduction unit configured to introduce microwaves to the dielectric member; and a second supply unit configured to supply a second process gas for generating a plasma into the one or more cavities of the dielectric member, wherein the masking portion is configured to separate a plasma generating space from the processing space, and a distance between a placing surface of the stage for mounting a substrate and the first surface is from 5 mm to 40 mm, wherein the microwave introduction unit includes a slot plate which is made of metal, and wherein the dielectric member constitutes a dielectric window provided between the slot plate and the masking portion, the dielectric window being configured to transmit microwaves therethrough.

* * * * *